United States Patent
Benammar

(10) Patent No.: US 10,187,067 B2
(45) Date of Patent: Jan. 22, 2019

(54) PHASE-LOCKED LOOP (PLL)-TYPE RESOLVER/CONVERTER METHOD AND APPARATUS

(71) Applicant: QATAR UNIVERSITY, Doha (QA)

(72) Inventor: Mohieddine Benammar, Doha (QA)

(73) Assignee: QATAR UNIVERSITY, Doha (QA)

( * ) Notice: Subject to any disclaimer, the term of this patent is extended or adjusted under 35 U.S.C. 154(b) by 304 days.

(21) Appl. No.: 14/883,493

(22) Filed: Oct. 14, 2015

(65) Prior Publication Data

US 2016/0102996 A1  Apr. 14, 2016

Related U.S. Application Data

(60) Provisional application No. 62/063,535, filed on Oct. 14, 2014.

(51) Int. Cl.
| | |
|---|---|
| *H03L 7/08* | (2006.01) |
| *G01D 5/20* | (2006.01) |
| *H03L 7/093* | (2006.01) |

(52) U.S. Cl.
CPC ............ *H03L 7/08* (2013.01); *G01D 5/2073* (2013.01); *H03L 7/093* (2013.01)

(58) Field of Classification Search
None
See application file for complete search history.

(56) References Cited

U.S. PATENT DOCUMENTS

| 5,160,886 A | 11/1992 | Carlen |
| 5,162,798 A | 11/1992 | Yundt |
| 5,635,810 A | 6/1997 | Goel |

(Continued)

FOREIGN PATENT DOCUMENTS

| CN | 102597709 A | 7/2012 |
| EP | 1 560 085 | 8/2005 |

(Continued)

OTHER PUBLICATIONS

Al-Emadi, Nasser A. et al., "A new tracking technique for mechanical angle measurement," Measurement, Aug. 2014, 54, pp. 58-64.

(Continued)

*Primary Examiner* — Reema Patel
*Assistant Examiner* — Steven Christopher
(74) *Attorney, Agent, or Firm* — Squire Patton Boggs (US) LLP

(57) ABSTRACT

An apparatus and method for determining an angle ψ an estimate of a true angle θ from a resolver excitation signal $V_{ex}(t)=A\sin(\omega t)$ and modulated resolver output signals $V_s(t,\theta)=A\times\sin(\theta)\times\sin(\omega t)$ and $V_C(t,\theta)=A\times\cos(\theta)\times\sin(\omega t)$, where ω is an angular frequency and t is time, is provided. The apparatus may include a converter comprising a closed loop phase-locked loop (PLL) system configured to produce an angle ψ and two digital signals Bit0(θ) and Bit1(θ) for estimating the true angle θ using $V_{ex}(t)$, $V_s(t,\theta)$ and $V_C(t,\theta)$ signals.

12 Claims, 8 Drawing Sheets

(56) References Cited

U.S. PATENT DOCUMENTS

| | | | |
|---|---|---|---|
| 6,525,502 | B1 | 2/2003 | Piedl et al. |
| 7,009,535 | B2 | 3/2006 | Kanekawa |
| 7,388,527 | B2 * | 6/2008 | Kushihara ............ H03M 1/1076 |
| | | | 341/114 |
| 7,692,566 | B2 | 4/2010 | Inoue |
| 8,004,434 | B2 | 8/2011 | Nakazato et al. |
| 8,589,105 | B2 | 11/2013 | Komosaki et al. |
| 2009/0105979 | A1 * | 4/2009 | Escobar Valderrama ................... |
| | | | H03L 7/08 |
| | | | 702/72 |
| 2014/0347941 | A1 * | 11/2014 | Jose ....................... G11C 7/222 |
| | | | 365/191 |
| 2016/0054152 | A1 * | 2/2016 | Goto .................... G01D 5/2073 |
| | | | 324/207.12 |

FOREIGN PATENT DOCUMENTS

| | | |
|---|---|---|
| GB | 2 447 901 | 10/2008 |
| GB | 2 448 350 | 10/2008 |
| GB | 2 471 458 | 1/2011 |
| JP | S61239224 A | 10/1986 |
| WO | WO 2000/033466 A1 | 6/2000 |

OTHER PUBLICATIONS

Alhamadi, M.A. et al; "Precise method for linearizing sine and cosine signals in resolvers and quadrature encoders applications," Industrial Electronics Society, 2004. IECON 2004. 30th Annual Conference of IEEE, vol. 2, Busan, South Korea, Nov. 2-6, 2004, pp. 1935-1940.

Anonymous, Catalog of Admotec "Understanding Resolvers and Resolver-to-Digital Conversion" http://www.admotec.com/TT02.pdf, 1998.

Benammar, M. et al., "Digitally-tuned resolver converter," Procedia Chemistry, 1, 2009, pp. 449-452.

Ben-Brahim, L. et al; "A new PLL method for resolvers," 2010 International Power Electronics Conference (IPEC), Sapporo, Japan, Jun. 21-24, 2010, pp. 299-305.

Gasking, John, "Resolver-to-Digital Conversion—A Simple and Cost Effective Alternative to Optical Shaft Encoders" Analog Devices Application Note AN-263 (1985).

Gupta, R.C. "Bhaskara 1's Approximation to Sine," Indian Journal of History of Science, vol. 2, No. 2, 1967, pp. 121-136.

Meyer, R. G. et al., "The Differential Pair as a Triangle-Sine Wave Converter," IEEE Journal of Solid-State Circuits, SC-11, Jun. 1976, pp. 418-420.

* cited by examiner

*: experimentally adjusted from the theoretical value of 18kΩ to 23kΩ for minimum distortion.

PHASE-LOCKED LOOP (PLL)-TYPE RESOLVER/CONVERTER METHOD AND APPARATUS

CROSS REFERENCE TO RELATED APPLICATIONS

The present application is related to and claims the benefit and priority of U.S. Provisional Patent Application No. 62/063,535, filed Oct. 14, 2014, the entirety of which is hereby incorporated herein by reference.

FIELD OF THE INVENTION

Embodiments of the invention may generally relate to a resolver to converter device and, in particular, some embodiments may specifically relate to a phase-locked loop (PLL)-type resolver/converter apparatus and method.

BACKGROUND

Resolvers have so far been widely used as reliable angle transducers especially suited to hostile environments. These devices are used in various positioning applications including robots, machine tools, aircrafts, radars and satellite antennas. Resolvers resemble small electric motors and are essentially rotary transformers designed so the coefficient of coupling between rotor and stator windings varies with the shaft angle (see the catalog of Admotec "*Understanding Resolvers and Resolver-to-Digital Conversion*" http://www.admotec.com/TT02.pdf, 1998 (non-patent document 1)). According to this document, the rotor winding of the resolver is used as primary and is supplied with a sinusoidal excitation voltage, $$V_{ex}(t) = A_{ex} \sin \omega t \quad (1)$$

As a result, the two windings located at right angles in the stator produce amplitude-modulated AC signals, one with the sine and the other with the cosine of shaft angle, θ. If the angular velocity of the rotor is much smaller than ω, a condition usually fulfilled because of the relatively elevated excitation or carrier frequency (typically a few kHz), the stator waveforms of the resolver are given by:

$$V_C(t,\theta) = A \cos\theta \sin\omega t \quad (2)$$

$$V_S(t,\theta) = A \sin\theta \sin\omega t \quad (3)$$

where A is a constant determined by the amplitude of the excitation signal and the transformation ratio, α, between stator and rotor windings ($A = \alpha A_{ex}$). Hence, the resolver converts the mechanical angle θ to analog modulated signals $V_s(t,\theta)$ and $V_C(t,\theta)$, having sin(θ) and cos(θ) components as modulating signals respectively. The signals and modules illustrated in FIG. 1 are some of the elements for the processing of information out of the resolver.

Non-Patent Background Documents

1. Catalog of Admotec "*Understanding Resolvers and Resolver-to-Digital Conversion*" http://www.admotec.com/TT02.pdf, 1998
2. L. Ben-Brahim and M. Benammar, "A new PLL method for resolvers," 2010 *International Power Electronics Conference (IPEC), Sapporo, Japan*, 21-24 Jun. 2010, pp. 299-305
3. N. Al-Emadi, L. Ben-Brahim, and M. Benammar, "A New Tracking Technique for Mechanical Angle Measurement," Measurement, Volume 54, August 2014, Pages 58-64
4. R. G. Meyer, W. M. C. Sansen, S. Lui and S. Peeters, "The Differential Pair as a Triangle-Sine Wave Converter," *IEEE Journal of Solid-State Circuits*, SC-11, June 1976, pp. 418-420
5. R. C. Gupta, "Bhaskara I's Approximation to Sine," *Indian Journal of History of Science*, Vol. 2, no. 2, 1967, pp. 121-136

Patent Background Documents

1. PLL Type Resolver/Digital Converter JP60079221 (May 7, 1985)
2. Resolver To Digital Converter U.S. Pat. No. 5,162,798 (Nov. 10, 1992)
3. Resolver/Digital Converter And Control Apparatus U.S. Pat. No. 7,009,535 (Mar. 7, 2006)
4. Resolver To 360 degrees Linear Analog Converter And Method WO2000033466A 1 (Jun. 8, 2000)
5. PLL type resolver to 360 degrees linear converter apparatus GB2448350B (Jan. 6, 2011)

SUMMARY OF THE INVENTION

One embodiment is directed to an apparatus for determining an angle ψ an estimate of a true angle θ from a resolver excitation signal $V_{ex}(t) = A \sin(\omega t)$ and modulated resolver output signals $V_s(t,\theta) = A \times \sin(\theta) \times \sin(\omega t)$ and $V_C(t,\theta) = A \times \cos(\theta) \times \sin(\omega t)$, where ω is an angular frequency and t is time. The apparatus comprises a converter comprising a closed loop phase-locked loop (PLL) system configured to produce an angle ψ and two digital signals BitØ(θ) and Bit1(θ) for estimating the true angle θ using $V_{ex}(t)$, $V_s(t,\theta)$ and $V_C(t,\theta)$ signals.

In an embodiment, the high frequency signal $V_{ex}(t)$ is an excitation signal generated by an external generator, and the modulated signals $V_s(t,\theta)$ and $V_C(t,\theta)$ are response signals received from an external device in response to the excitation signal $V_{ex}(t)$ and to a mechanical angle θ.

According to one embodiment, the closed-loop PLL system comprises a phase detector configured to produce a |sin(ωt)|×(|sin(θ)|cos(ψ)−|cos(θ)|sin(ψ)) signal from the signals $V_s(t,\theta)$, $V_C(t,\theta)$, sin(ψ) and cos(ψ), a controller and integrator configured to ensure that ψ tracks changes of the true angle θ, and a quadrant identification circuit configured to use the signals $V_{ex}(t)$, $V_s(t,\theta)$ and $V_C(t,\theta)$ to produce two binary signals BitØ(θ) and Bit1(θ) for identifying the four quadrants of the true angle θ.

In an embodiment, the apparatus may further include a sin(ψ) and cos(ψ) extraction circuit comprising means for converting triangular waveform ψ into sin(ψ) and cos(ψ) using signal shaping or approximation methods.

Another embodiment is directed to a method including determining an angle ψ an estimate of a true angle θ from a resolver excitation signal $V_{ex}(t) = A \sin(\omega t)$ and modulated resolver output signals $V_s(t,\theta) = A \times \sin(\theta) \times \sin(\omega t)$ and $V_C(t,\theta) = A \times \cos(\theta) \times \sin(\omega t)$, where ω is an angular frequency and t is time. The determining may comprise producing, by a converter comprising a closed loop phase-locked loop (PLL) system, an angle ψ and two digital signals BitØ(θ) and Bit1(θ) for estimating the true angle θ using $V_{ex}(t)$, $V_s(t,\theta)$ and $V_C(t,\theta)$ signals.

According to an embodiment, the method may further include producing, by a phase detector of the closed-loop PLL system, a $|\sin(\omega t)| \times (|\sin(\theta)|\cos(\psi) - |\cos(\theta)|\sin(\psi))$ signal from the signals $V_s(t,\theta)$, $V_C(t,\theta)$, $\sin(\psi)$ and $\cos(\psi)$. The method may also include ensuring, by a controller and integrator, that $\psi$ tracks changes of the true angle $\theta$, and using, by a quadrant identification circuit, the signals $V_{ex}(t)$, $V_s(t,\theta)$ and $V_C(t,\theta)$ to produce two binary signals $\text{Bit}\emptyset(\theta)$ and $\text{Bit}1(\theta)$ for identifying the four quadrants of the true angle $\theta$.

In one embodiment, the method may also include converting, by a $\sin(\psi)$ and $\cos(\psi)$ extraction circuit, triangular waveform $\psi$ into $\sin(\psi)$ and $\cos(\psi)$ using signal shaping or approximation methods.

Another embodiment is directed to an apparatus including determining means for determining an angle $\psi$ an estimate of a true angle $\theta$ from a resolver excitation signal $V_{ex}(t) = A\sin(\omega t)$ and modulated resolver output signals $V_s(t,\theta) = A \times \sin(\theta) \times \sin(\omega t)$ and $V_C(t,\theta) = A \times \cos(\theta) \times \sin(\omega t)$, where $\omega$ is an angular frequency and t is time. The determining means may comprise means for producing, by a converter comprising a closed loop phase-locked loop (PLL) system, an angle $\psi$ and two digital signals $\text{Bit}\emptyset(\theta)$ and $\text{Bit}1(\theta)$ for estimating the true angle $\theta$ using $V_{ex}(t)$, $V_s(t,\theta)$ and $V_C(t,\theta)$ signals.

In an embodiment, the apparatus may further include means for producing, by a phase detector of the closed-loop PLL system, a $|\sin(\omega t)| \times (|\sin(\theta)|\cos(\psi) - |\cos(\theta)|\sin(\psi))$ signal from the signals $V_s(t,\theta)$, $V_C(t,\theta)$, $\sin(\psi)$ and $\cos(\psi)$. The apparatus may also include means for ensuring, by a controller and integrator, that $\psi$ tracks changes of the true angle $\theta$, and means for using, by a quadrant identification circuit, the signals $V_{ex}(t)$, $V_s(t,\theta)$ and $V_C(t,\theta)$ to produce two binary signals $\text{Bit}\emptyset(\theta)$ and $\text{Bit}1(\theta)$ for identifying the four quadrants of the true angle $\theta$.

According to one embodiment, the apparatus may further include means for converting, by a $\sin(\psi)$ and $\cos(\psi)$ extraction circuit, triangular waveform $\psi$ into $\sin(\psi)$ and $\cos(\psi)$ using signal shaping or approximation methods.

BRIEF DESCRIPTION OF THE DRAWINGS

For proper understanding of the invention, reference should be made to the accompanying drawings, wherein.

DETAILED DESCRIPTION

It will be readily understood that the components of the invention, as generally described and illustrated in the figures herein, may be arranged and designed in a wide variety of different configurations. Thus, the following detailed description of embodiments of a PLL-type resolver/converter apparatus and method, as represented in the attached figures, is not intended to limit the scope of the invention, but is merely representative of selected embodiments of the invention.

The features, structures, or characteristics of the invention described throughout this specification may be combined in any suitable manner in one or more embodiments. For example, the usage of the phrases "certain embodiments," "some embodiments," or other similar language, throughout this specification refers to the fact that a particular feature, structure, or characteristic described in connection with the embodiment may be included in at least one embodiment of the present invention. Thus, appearances of the phrases "in certain embodiments," "in some embodiments," "in other embodiments," or other similar language, throughout this specification do not necessarily all refer to the same group of embodiments, and the described features, structures, or characteristics may be combined in any suitable manner in one or more embodiments.

Additionally, if desired, the different functions discussed below may be performed in a different order and/or concurrently with each other. Furthermore, if desired, one or more of the described functions may be optional or may be combined. As such, the following description should be considered as merely illustrative of the principles, teachings and embodiments of this invention, and not in limitation thereof.

Figure 1:
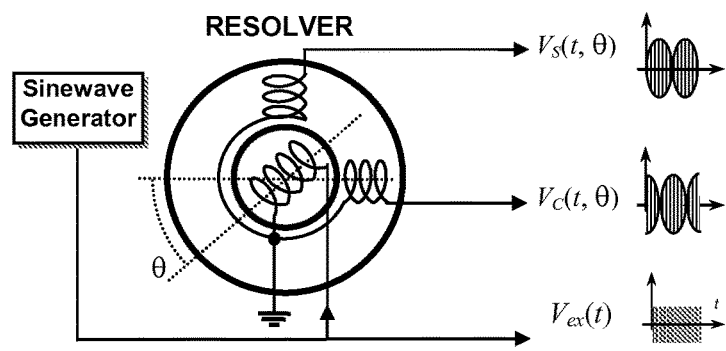
FIG. 1 illustrates a diagram depicting the principle of operation of a resolver with its input (excitation) and output signals.
Figure 2:
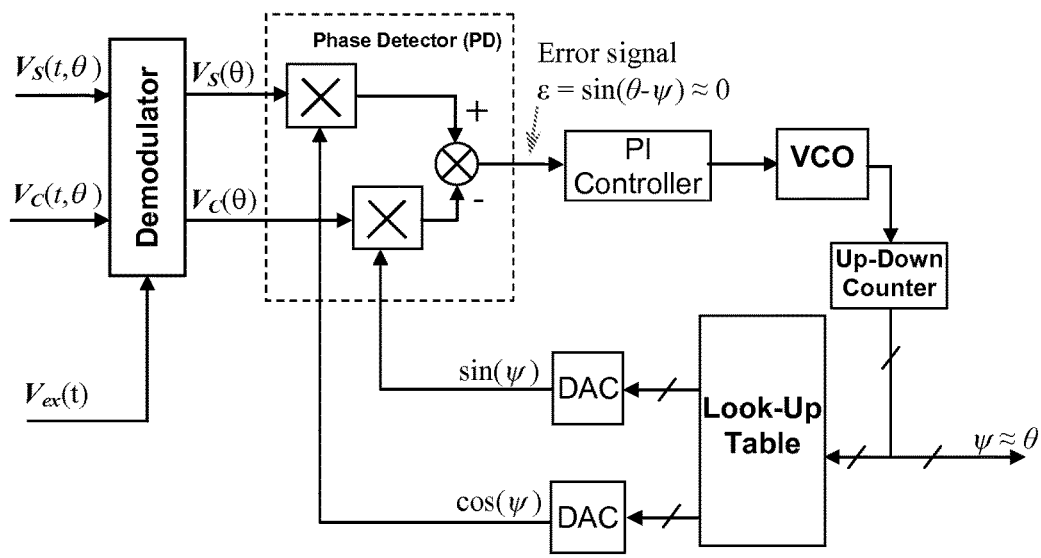
FIG. 2 illustrates a conventional PLL converter with VCO, LUT and DACs.

Commercial resolver converters are built mainly around the successful PLL tracking method. This PLL system is based upon the operation in a closed loop in which an estimated angle, $\psi$, tracks the shaft angle, $\theta$, as illustrated in FIG. 2. The system includes a demodulator for removing the carrier (excitation signal) from the resolver signals and means of computation of the sine and cosine of the estimated angle, usually from a look-up table addressed with an up/down counter. The phase detector may be composed of two multipliers and one subtractor to calculate the error signal $\sin(\theta - \psi)$. The PI controller guarantees at steady state the convergence of the estimated angle $\psi$ towards the true angle, $\theta$ by making $\sin(\theta - \psi) \approx 0 \approx \theta - \psi$. This PLL system may include: 1. Demodulator, 2. Phase Detector (PD), 3. Voltage Controlled Oscillator (VCO), 3. Up-Down counter, 4. Digital-to-Analog Converters (DACs), and 5. Look-Up Table (LUT) for the digital measurement of the sine and cosine of the estimated angle.

Figure 3:
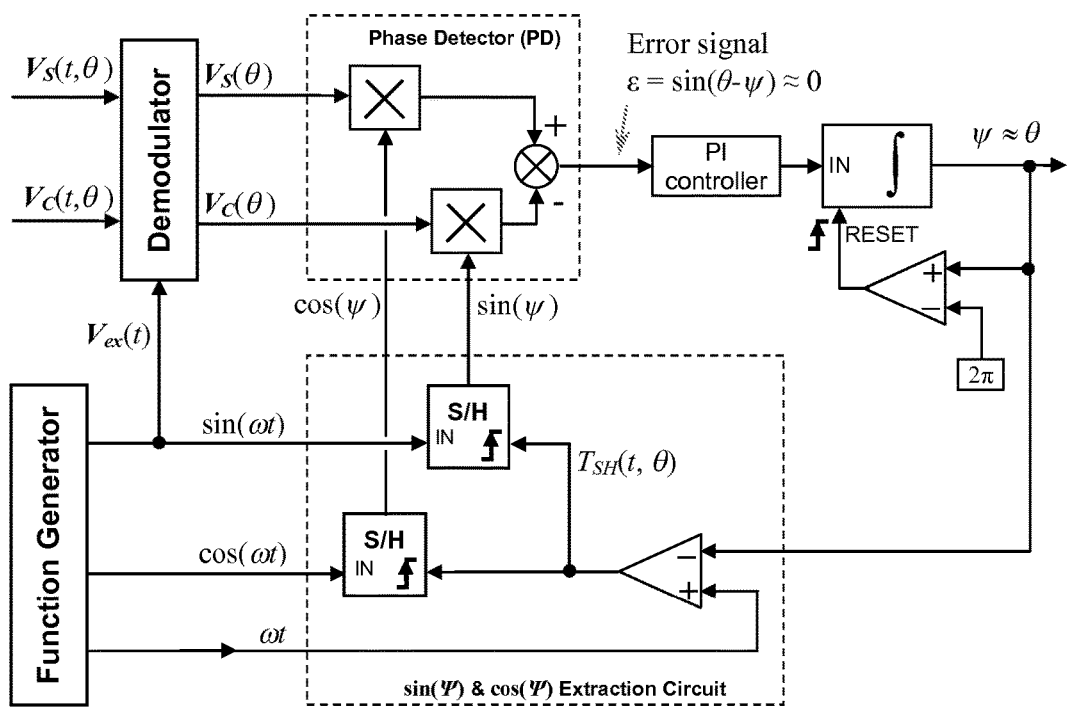
FIG. 3 illustrates the PLL converter scheme of GB2448350B (Patent document 5)

A modified implementation of the classical PLL converter has been presented in patent document 5, as illustrated in FIG. 3. Implementation of this method has been reported in non-patent documents 2 and 3. Although the aim of this was to simplify implementation of the PLL converter, the method is still complicated and requires availability of three precise and synchronized reference signals (sine, cosine and sawtooth waveforms). A scheme of comparator and sample and hold devices is used to determine the required sine and cosine of the estimated angle $\psi$. Another drawback of this method is that the scheme produces a single sample of sin(ψ) and cos(ψ) in each period of the excitation signal as the sampling frequency (f=ω/2π). This means that the converter can only work at low resolvers' speed of rotation (i.e., slow variation of θ and therefore of ψ). Additionally, the method requires an additional way of resetting the integrator at the end of each revolution of the shaft of the resolver, which introduces additional complexity.

In view of the above, embodiments of the present invention relate to a resolver to linear analog/digital converter apparatus and method for determining the unknown resolver rotor angle θ from the modulated resolver signals: sin(ωt)×sin(θ) and sin(ωt)×cos(θ). More specifically, one embodiment includes a PLL closed-loop method for converting the amplitudes of the modulated transducer signals into a measure of the input angle without using synchronized reference signals, demodulators, VCOs, low-pass filters (LPFs), DACs and LUTs. A PLL method, according to an embodiment, is based on a closed loop system which provides an estimated value of the input angle and which includes (i) computation of the sine and cosine values of this estimated angle, and (ii) the demodulation of the resolver signals.

Thus, a method of conversion, according to certain embodiments of the invention, may be applied to a resolver without using demodulators, synchronized reference signals, sample and hold devices, LUT, DAC, VCO, and LPF. Instead, an embodiment (i) derives the required sine and cosine values of the estimated angle from the converter output using simple signal shaping arrangement, and (ii) does not require demodulation of the resolver signals.

In classical PLL converters, (i) the determination of the sine and cosine values of the estimated angle requires complicated schemes that involve either ADC and DAC conversion or sampling synchronized reference signals, and (ii) the demodulation is achieved using either sampling or multiplication and filtering techniques. In contrast, embodiments of the invention provide several advantages, which may include: (1) embodiments derive the required sine and cosine values of the estimated angle from the converter output using simple arrangement without LUTs and without the need for synchronized reference signals, and (2) embodiments do not require demodulation of the resolver signals. In addition, embodiments of the invention may be implemented easily using digital or basic analog electronic circuitry.

One embodiment is directed to an apparatus, for example in the form of a resolver to analog or digital converter, for converting the amplitude-modulated input sine and cosine signals into signals representative of position and/or speed. For instance, an embodiment includes a new scheme applied to a resolver to converter device. Conventional PLL methods of resolver-to-digital (R/D) converters are based on a closed loop system which provides an estimated angle value that tracks the input angle. As mentioned above, the implementation of conventional PLL converters requires (i) computation of the sine and cosine values of this estimated angle, and (ii) the demodulation of the resolver signals.

Embodiments of the invention, however, simplify the derivation of the angle without compromising the required dynamics and precision of the conversion process, and may include a R/D converter circuit applied to a resolver or sinusoidal quadrature encoders.

As discussed above, conventional PLL methods of R/D converters use arrangements that are complicated to implement, particularly in hardware. An embodiment of the present invention, based on the PLL technique and applied for example to a resolver, does not require complicated hardware for its implementation. Embodiments of the invention can simplify the derivation of the angle without compromising required dynamics and precision of these techniques.

Although the prior art system, PLL, thus described is capable of high performance both at transient and at steady state, there are a number of aspects that can be improved. The major difficulty with prior art systems is the implementation which needs a mixed analog and digital circuit which presents a complex and difficult task in the construction of the converter. Furthermore, as mentioned above, many components are used such as a demodulator, a Look-up table (addressable memory), an up-down counter, DACs and a VCO. VCO and its associated components have a maximum operating frequency which, when combined with the resolution of the converter, defines a maximum resolver angular speed that the converter can track. Further, VCOs operate linearly only over a limited range (see patent document 2).

A modified implementation of the classical PLL converter has been presented in patent document 5. However, the method described therein is still complicated and requires the availability of three precise and synchronized reference signals (sine, cosine and sawtooth waveforms) which is not a trivial task. It uses a resettable integrator and a scheme of comparator and sample and hold devices that slow down the operation of the feedback loop of the converter which can only work at low resolvers' speed of rotation.

Figure 4:
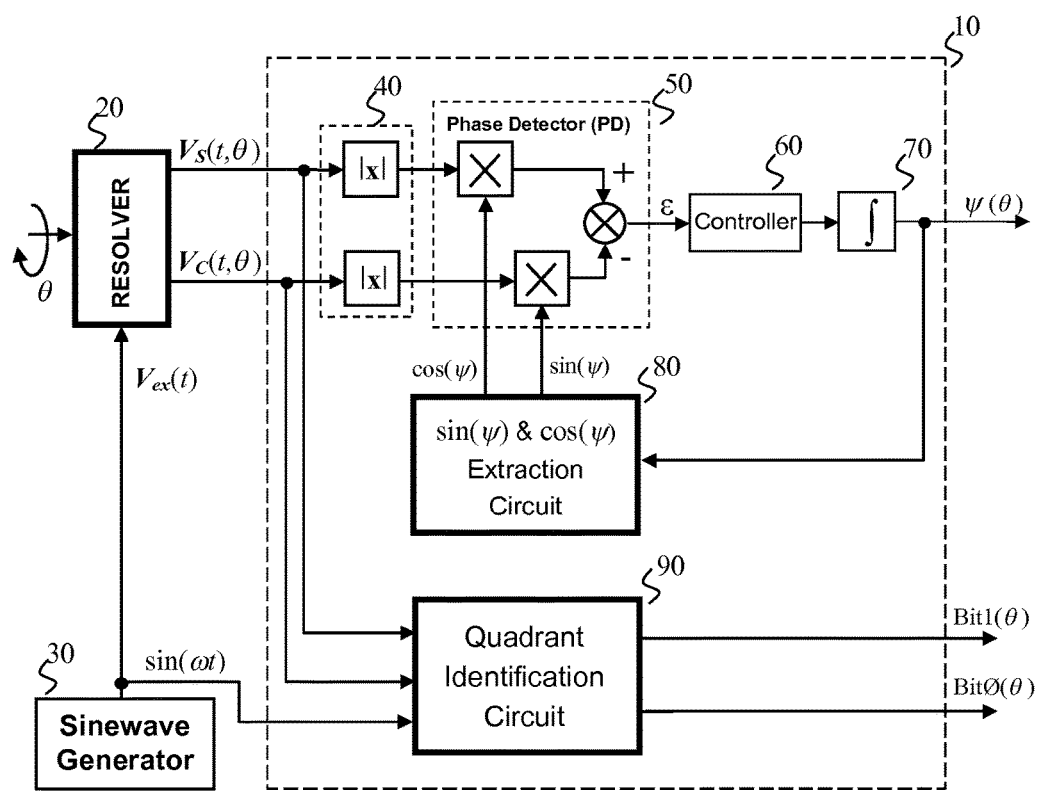
FIG. 4 illustrates a block diagram of an apparatus, according to an embodiment of the present invention.

Therefore, an objective of the present invention is to simplify the PLL implementation by reducing the number of components used in the circuit, and by avoiding the need for three synchronized reference signals. FIG. 4 illustrates a detailed block diagram of an embodiment of the present invention for the resolver to linear converter using PLL method. As illustrated in FIG. 4, a converter 10 produces a linear analog signal that is linearly proportional to the shaft angle of resolver 20 in the four identifiable quadrants of the full 360 degrees angle range. A generator 30 produces a sinusoidal carrier excitation signal to the resolver.

The resolver 20 converts the mechanical angle θ to analog modulated signals $V_s(t,\theta)$ and $V_C(t,\theta)$, having sin(θ) and cos(θ) components as modulating signals, respectively. The $V_s(t,\theta)$ and $V_C(t,\theta)$ output signals from the resolver 20 and the excitation signal are processed by the converter 10 to provide a measure of the input mechanical angle θ.

The converter 10 may incorporate two absolute value circuits 40 that are used to provide the absolute values of the modulated output signals $V_s(t,\theta)$ and $V_C(t,\theta)$ (equations 2 and 3) of the resolver. The absolute values of $V_s(t,\theta)$ and $V_C(t,\theta)$ are inputs to the phase detector (PD) 50. The additional inputs to the PD 50 are sin(ψ) and cos(ψ) derived from the extraction circuit 80 as discussed in detail below. The PD 50 produces an error signal related to the sine of a combination of ψ and θ. This error signal is input to a controller 60 which may be a P controller. The output of the controller 60 is integrated by an integrator 70. The closed loop will work towards an error signal (output of PD 50) close to zero. At steady state, the error signal converges to zero and the integrator 70 produces an output ψ which is an estimate of the true angle θ.

The phase detector PD circuit 50 may be composed of two multipliers and one subtractor to calculate the error signal ε. Ignoring the actual amplitudes of signals, and using normalized inputs to the PD, it can be written:

$$\varepsilon(t, \theta) = (|\sin(\omega t)\sin(\theta)| \times \cos\psi) - \quad (4)$$

-continued $$(|\sin(\omega t)\cos(\theta)| \times \sin\psi)$$
$$= |\sin(\omega t)| \times (|\sin\theta| \times \cos\psi - |\cos\theta| \times \sin\psi)$$

The average (dc) error is:

$$\overline{\varepsilon}(\theta) = \frac{2}{\pi} \times [(|\sin\theta| \times \cos\psi) - (|\cos\theta| \times \sin\psi)] \quad (5)$$

Figure 5:
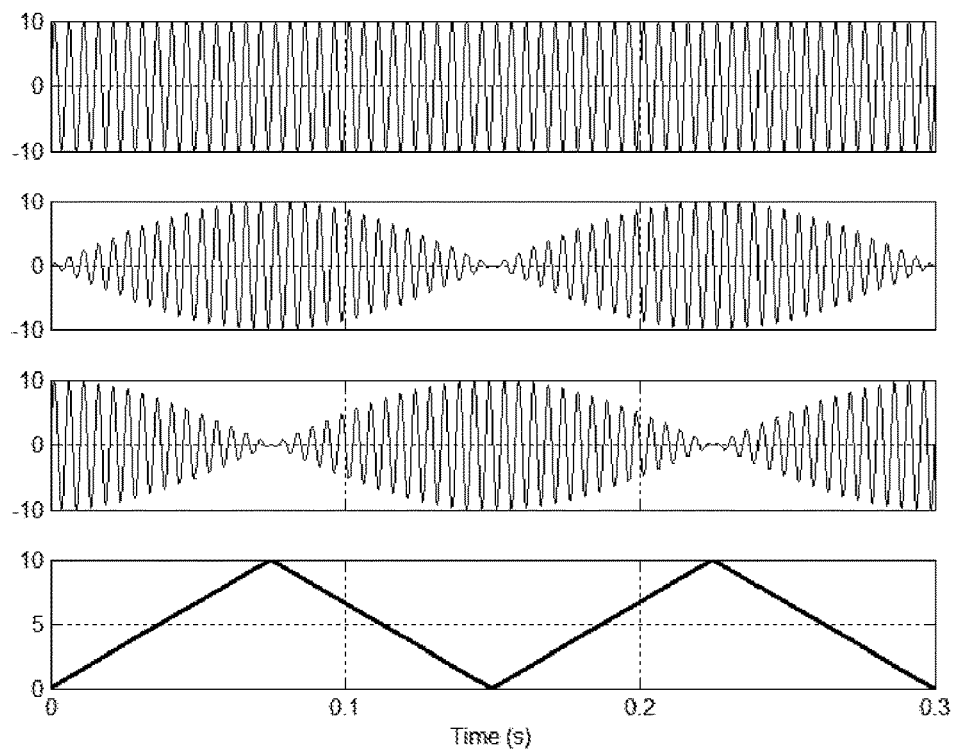
FIG. 5 illustrates input and output waveforms of a converter for one full revolution of the resolver shaft with a resolver excitation frequency of 200 Hz, according to one embodiment.
Figure 5:
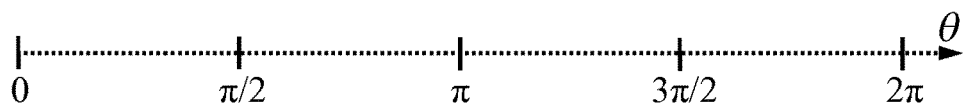
Figure 8:
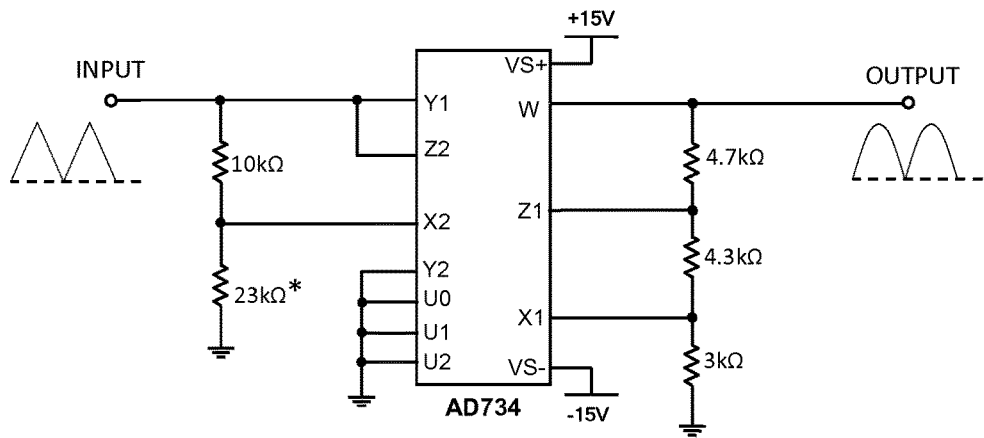
FIG. 8 illustrates an example analog implementation of conversion of $\psi$ voltage into $\sin(\psi)$ voltage using rational approximation technique, according to an embodiment.
Figure 8:
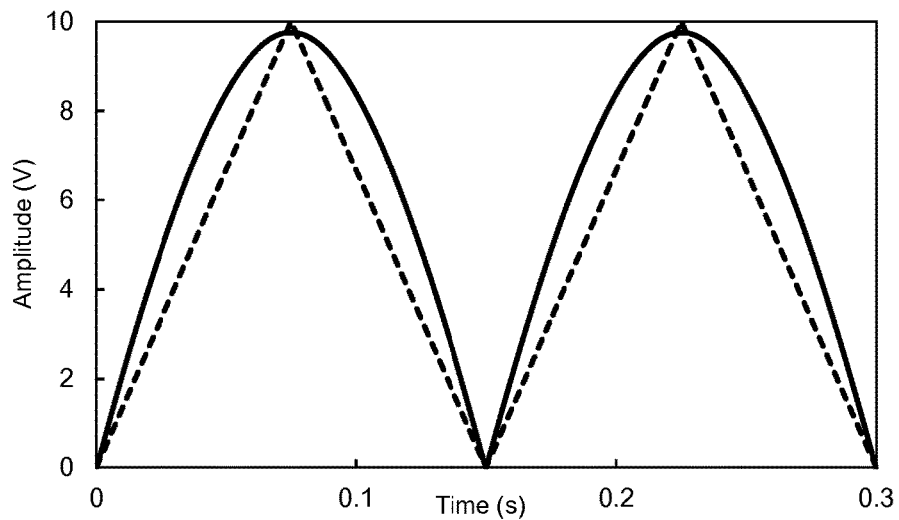
Figure 8:
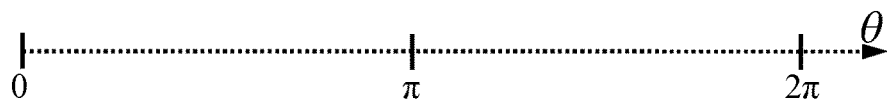

The average error may be determined in the four quadrants of input angle θ as shown in Table I below. At steady state, the error signal converges to zero and the integrator 70 produces an output ψ which is an estimate of the true angle θ, as shown in Table I. FIG. 5 illustrates the converter input and output waveforms ($V_{ex}(t)$, $V_s(t,\theta)$, $V_c(t,\theta)$ and ψ(θ)) for a full one revolution of the resolver shaft at a fixed speed of 200 rpm. For clarity reasons and in order to show details, the waveforms are shown for a low resolver excitation frequency f=200 Hz (or ω=400π rad/s); in reality, however, this is typically 4 kHz.

been tuned for a ψ(θ) signal with a maximum amplitude of 10V (equivalent to π/2). FIG. 8 illustrates an example of analog implementation for the approximation of sin(ψ) from ψ(θ) using approximation techniques (see non-patent document 5). In FIG. 8, an analog multiplier is used to implement the following rational approximation:

$$10\sin(\theta) \approx \frac{\psi\left(1 - \frac{9\psi}{140}\right)}{\frac{7.3}{12} - \frac{\psi}{40}} \quad (6)$$

It is noted that the analog multiplier used may be a single quadrant multiplier as both input and outputs are positive.

Figure 9:
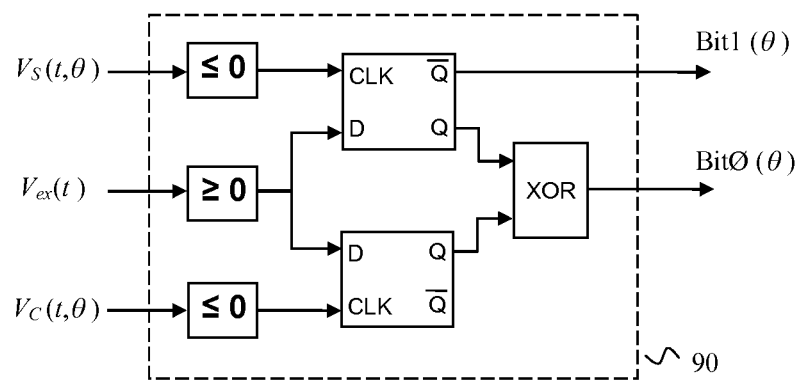
FIG. 9 illustrates a block diagram of a quadrant identification circuit, according to an embodiment.

FIG. 9 illustrates a block diagram of the quadrant identification circuit 90 producing the two digital outputs BitØ(θ) and Bit1(θ), according to an embodiment. Given the triangular shape of ψ(θ), this quadrant identification is used in order to have an unambiguous measure of θ. The circuit 90 may include three comparators, two D-flip-flops and one XOR gate. The principle of operation is based on determin-

TABLE I

Loop error signal and relationship between input angle θ and converter output ψ.

| Quadrant of input angle θ | Loop error signal | Converter output ψ at steady state |
|---|---|---|
| θ ∈ [0, π/2] | $\overline{\varepsilon}(\theta) = \frac{2}{\pi} \times (\sin(\theta)\cos(\psi) - \cos(\theta)\sin(\psi))$<br>$= \frac{2}{\pi} \times \sin(\theta - \psi)$ | ψ = θ |
| θ ∈ [π/2, π] | $\overline{\varepsilon}(\theta) = \frac{2}{\pi} \times (\sin(\theta)\cos(\psi) + \cos(\theta)\sin(\psi))$<br>$= \frac{2}{\pi} \times (\sin(\pi - \theta)\cos(\psi) - \cos(\pi - \theta)\sin(\psi))$<br>$= \frac{2}{\pi} \times \sin(\pi - \theta - \psi)$ | ψ = π - θ |
| θ ∈ [π, 3π/2] | $\overline{\varepsilon}(\theta) = \frac{2}{\pi} \times (-\sin(\theta)\cos(\psi) + \cos(\theta)\sin(\psi))$<br>$= \frac{2}{\pi} \times (\sin(\theta - \pi)\cos(\psi) - \cos(\theta - \pi)\sin(\psi))$<br>$= \frac{2}{\pi} \times \sin(\theta - \pi - \psi)$ | ψ = θ - π |
| θ ∈ [3π/2, 2π] | $\overline{\varepsilon}(\theta) = \frac{2}{\pi} \times (-\sin(\theta)\cos(\psi) - \cos(\theta)\sin(\psi))$<br>$= \frac{2}{\pi} \times (\sin(2\pi - \theta)\cos(\psi) - \cos(2\pi - \theta)\sin(\psi))$<br>$= \frac{2}{\pi} \times \sin(2\pi - \theta - \psi)$ | ψ = 2π - θ |

Figure 6:
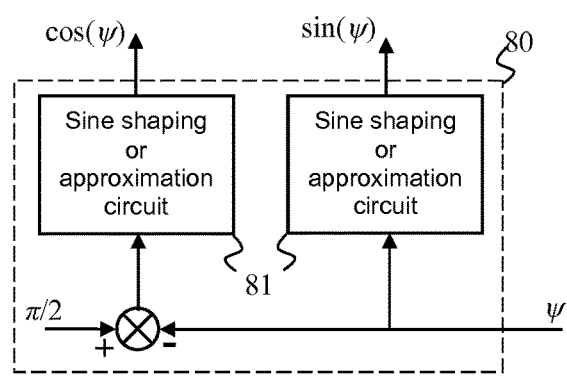
FIG. 6 illustrates a block Diagram of an extraction circuit of $\sin(\psi)$ and $\cos(\psi)$ from $\psi$, according to an embodiment.

FIG. 6 illustrates a block diagram of the extraction circuit 80 of sin(ψ) and cos(ψ) from ψ, according to one embodiment. Given that the signal ψ(θ) is of triangular nature, its conversion to an approximation of sin(ψ) can be achieved using various methods including signal shaping approximation techniques. The same technique can be applied to generate an approximation of cos(ψ) by first inverting ψ(θ) and then adding an offset equivalent to π/2.

Figure 7:
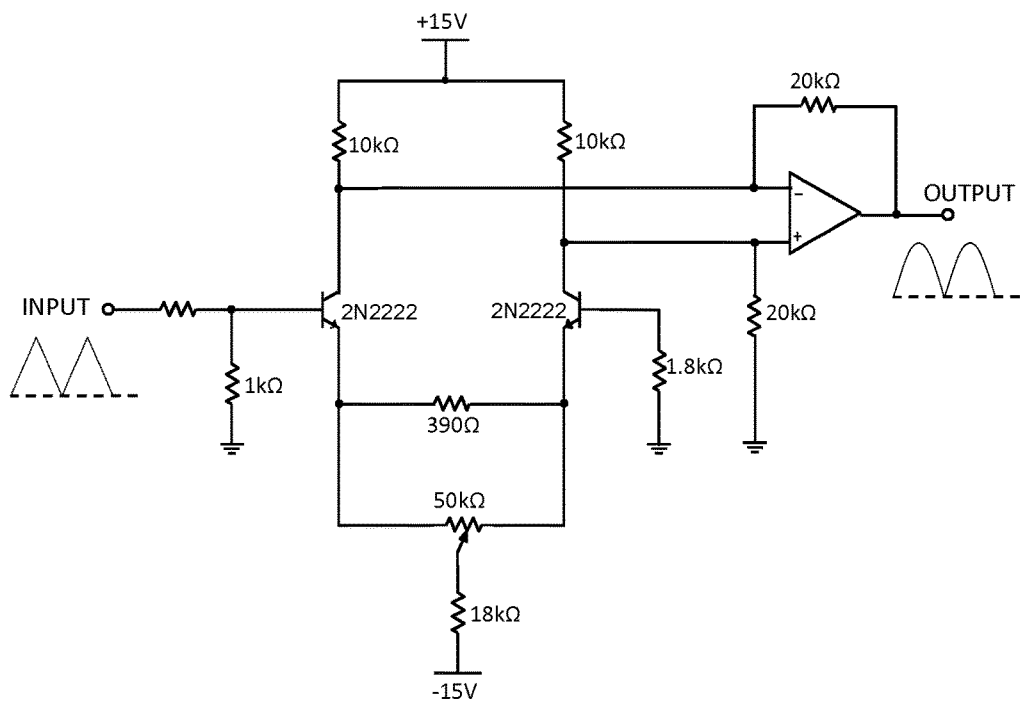
FIG. 7 illustrates an example analog implementation of conversion of $\psi$ voltage into $\sin(\psi)$ voltage using signal shaping technique, according to an embodiment.
Figure 7:
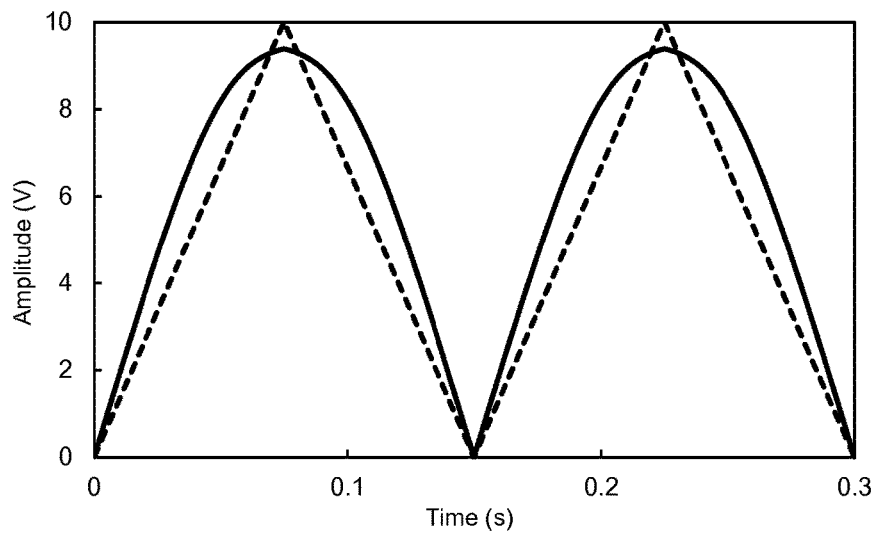
Figure 7:
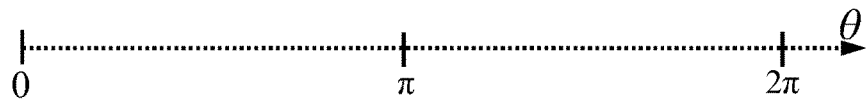
Figure 10:
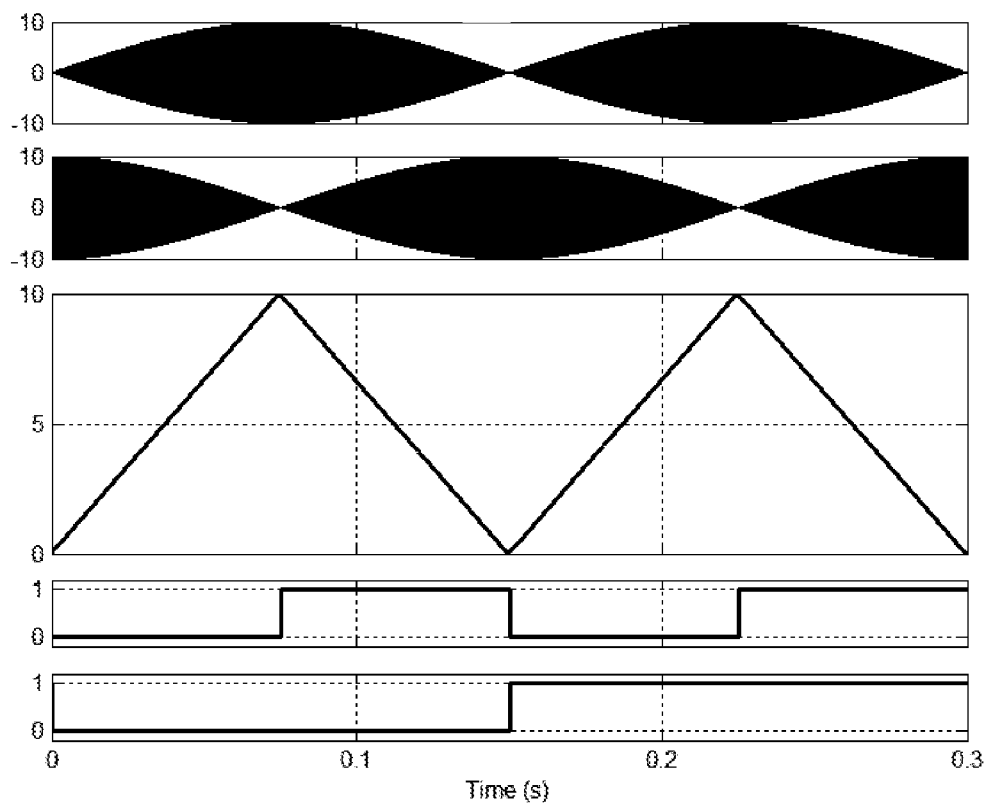
FIG. 10 illustrates input and output waveforms of the proposed converter for one full revolution of the resolver shaft with a resolver excitation frequency of 4 kHz, according to an embodiment.
Figure 10:
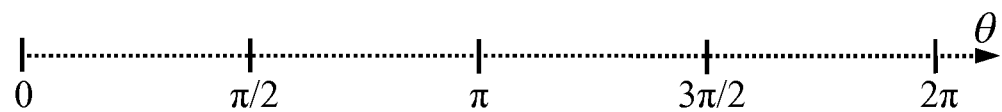

FIG. 7 illustrates one possible way for implementing the signal shaping technique. The circuit illustrated in FIG. 7 has ing the phases of $V_s(t,\theta)$ and $V_c(t,\theta)$ relative to $V_{ex}(t)$; the phases depend on the signs of sin(θ) and cos(θ). FIG. 10 illustrates all input and output waveforms of the proposed converter for one full revolution of the resolver shaft with a typical resolver excitation frequency of 4 kHz.

In view of the above, embodiments of the present invention provide a resolver converter that uses the resolver output signals without the need for demodulation. Additionally, the required determination of the sine and cosine of the estimated angle is carried out in a straightforward way without the need for complicated mixed analog/digital circuitry. These improvements when compared to conventional PLL method reduce cost and simplify design without compromising performance.

In an embodiment, the converter output $\psi$ is equivalent to angle varying between 0 and $\pi/2$, and hence $\sin(\psi)$ and $\cos(\psi)$ are always positive. This means all inputs and outputs of the two multipliers of the PD (60) can be single quadrant multipliers, as opposed to a conventional PLL method which require expensive four-quadrant multipliers.

The fact that $\psi$ varies between 0 and $\pi/2$ simplifies greatly the determination of $\sin(\psi)$ and $\cos(\psi)$ as simple signal shaping networks or simple approximation formulas may be used to convert $\psi$ into $\sin(\psi)$ and $\cos(\psi)$ using the extraction circuit 80. In conventional methods, the output of the integrator represents an angle varying between 0 and $\pi$ or $2\pi$, rendering extraction of $\sin(\psi)$ and $\cos(\psi)$ from $\psi$ more challenging and complicated.

Additionally, given that $\psi$ varies between 0 and $\pi/2$, an analog implementation of the converter would provide an analog voltage output with a full scale representing one quadrant (90 degrees) of input angle as opposed to the four quadrants (360 degrees) for the conventional converter. This means better sensitivity of the present invention compared to the conventional converter.

The converter, according to an embodiment, works with modulated resolver signals without the need for demodulators as is the case in conventional methods. This is made possible, in part, by using the absolute values circuits 40 which result in an error signal (output of PD 50) with a non-zero average value. In conventional methods without absolute units, the error signal would have a zero average value if no demodulators are used; this would mean that the control loop would not work and the converter would fail to provide a measure of $\theta$.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

What is claimed is:

1. A converter, comprising:
    an absolute value circuit configured to
        receive a resolver excitation signal $V_{ex}(t)=A \sin(\omega t)$ and modulated resolver output signals $V_s(t,\theta)=A\times\sin(\theta)\times\sin(\omega t)$ and $V_C(t,\theta)=A\times\cos(\theta)\times\sin(\omega t)$, where $\omega$ is an angular frequency, t is time, and A is a constant determined by an amplitude of the resolver excitation signal, and
        generate absolute values of the modulated output signals $V_s(t,\theta)=A\times\sin(\theta)\times\sin(\omega t)$ and $V_C(t,\theta)=A\times\cos(\theta)\times\sin(\omega t)$;
    a phase detector configured to receive the absolute values of the modulated output signals $V_s(t,\theta)=A\times\sin(\theta)\times\sin(\omega t)$ and $V_C(t,\theta)=A\times\cos(\theta)\times\sin(\omega t)$, and produce an error signal based on the absolute values of the modulated output signals $V_s(t,\theta)=A\times\sin(\theta)\times\sin(\omega t)$ and $V_C(t,\theta)=A\times\cos(\theta)\times\sin(\omega t)$, wherein the error signal is related to the sine of a combination of an angle $\psi$ and a true angle $\theta$;
    a controller configured to receive the error signal from the phase detector and output a signal based on the error signal;
    an integrator configured to directly receive the output signal from the controller and integrate the output signal; and
    a closed loop phase-lock system configured to convert amplitudes of the modulated output signals into a measure of input angle,
    wherein the amplitudes of the modulated output signals are converted without using synchronized reference signals, demodulators, voltage controlled oscillators, low-pass filters, digital-to-analog converters, and look-up-tables,
    wherein the converter is configured to determine the angle $\psi$ as an estimate of the true angle $\theta$ from the resolver excitation signal $V_{ex}(t)=A \sin(\omega t)$ and the modulated resolver output signals $V_s(t,\theta)=A\times\sin(\theta)\times\sin(\omega t)$ and $V_C(t,\theta)=A\times\cos(\theta)\times\sin(\omega t)$,
    wherein the converter is configured to produce the angle $\psi$ and two digital signals $Bit\emptyset(\theta)$ and $Bit1(\theta)$ for estimating the true angle $\theta$ using $V_{ex}(t)$, $V_s(t,\theta)$ and $V_C(t,\theta)$ signals,
    wherein the error signal converges to zero at steady state,
    wherein the integrator is further configured to output the angle $\psi$, and
    wherein the angle $\psi$ is equivalent to an angle between 0 and $\pi/2$.

2. The apparatus according to claim 1, wherein the high frequency signal $V_{ex}(t)$ is an excitation signal generated by an external generator, and the modulated signals $V_s(t,\theta)$ and $V_C(t,\theta)$ are response signals received from an external device in response to the excitation signal $V_{ex}(t)$ and to a mechanical angle $\theta$.

3. The apparatus according to claim 1, wherein
    the phase detector is configured to produce a $|\sin(\omega t)|\times(|\sin(\theta)|\cos(\psi)-|\cos(\theta)|\sin(\psi))$ signal from the signals $V_s(t,\theta)$, $V_C(t,\theta)$, $\sin(\psi)$ and $\cos(\psi)$,
    the controller and the integrator are configured to ensure that $\psi$ tracks changes of the true angle $\theta$, and
    the converter further comprises a quadrant identification circuit configured to use the signals $V_{ex}(t)$, $V_s(t,\theta)$ and $V_C(t,\theta)$ to produce two binary signals $Bit\emptyset(\theta)$ and $Bit1(\theta)$ for identifying the four quadrants of the true angle $\theta$.

4. The apparatus according to claim 1, further comprising a $\sin(\psi)$ and $\cos(\psi)$ extraction circuit comprising means for converting triangular waveform $\psi$ into $\sin(\psi)$ and $\cos(\psi)$ using signal shaping or approximation methods.

5. A method, comprising:
    receiving, at an absolute value circuit, a resolver excitation signal $V_{ex}(t)=A \sin(\omega t)$ and modulated resolver output signals $V_s(t,\theta)=A\times\sin(\theta)\times\sin(\omega t)$ and $V_C(t,\theta)=A\times\cos(\theta)\times\sin(\omega t)$, where $\omega$ is an angular frequency, t is time, and A is a constant determined by an amplitude of the resolver excitation signal;
    generating, at the absolute value circuit, absolute values of the modulated output signals $V_s(t,\theta)=A\times\sin(\theta)\times\sin(\omega t)$ and $V_C(t,\theta)=A\times\cos(\theta)\times\sin(\omega t)$;
    producing an error signal, at a phase detector, based on the absolute values of the modulated output signals $V_s(t,\theta)=A\times\sin(\theta)\times\sin(\omega t)$ and $V_C(t,\theta)$ $A\times\cos(\theta)\times\sin(\omega t)$, wherein the error signal is related to the sine of a combination of an angle $\psi$ and a true angle $\theta$;
    receiving, at a controller, the error signal from the phase detector;

generating, at the controller, an output signal based on the error signal;

directly receiving, at an integrator, the output signal from the controller, integrating, at the integrator, the output signal;

determining the angle ψ as an estimate of the true angle θ from the resolver excitation signal $V_{ex}(t)=A \sin(\omega t)$ and the modulated resolver output signals $V_s(t,\theta)=A \times \sin(\theta) \times \sin(\omega t)$ and $V_C(t,\theta)=A \times \cos(\theta) \times \sin(\omega t)$;

producing the angle ψ and two digital signals BitØ(θ) and Bit1(θ) for estimating the true angle θ using $V_{ex}(t)$, $V_s(t,\theta)$ and $V_C(t,\theta)$ signals;

outputting, from the integrator, the angle ψ, and converting amplitudes of the modulated output signals into a measure of input angle, wherein the amplitudes of the modulated output signals are converted without using synchronized reference signals, demodulators, voltage controlled oscillators, low-pass filters, digital-to-analog converters, and look-up-tables, wherein the error signal converges to zero at steady state, wherein the angle ψ is equivalent to an angle between 0 and π/2.

6. The method according to claim 5, wherein the high frequency signal $V_{ex}(t)$ is an excitation signal generated by an external generator, and the modulated signals $V_s(t,\theta)$ and $V_C(t,\theta)$ are response signals received from an external device in response to the excitation signal $V_{ex}(t)$ and to a mechanical angle θ.

7. The method according to claim 5, further comprising:

producing, by a phase detector, a $|\sin(\omega t)| \times (|\sin(\theta)|\cos(\psi) - |\cos(\theta)|\sin(\psi))$ signal from the signals $V_s(t,\theta)$, $V_C(t,\theta)$, sin(ψ) and cos(ψ);

ensuring, by a controller and integrator, that ψ tracks changes of the true angle θ; and using, by a quadrant identification circuit, the signals $V_{ex}(t)$, $V_s(t,\theta)$ and $V_C(t,\theta)$ to produce two binary signals BitØ(θ) and Bit1(θ) for identifying the four quadrants of the true angle θ.

8. The method according to claim 5, further comprising:

converting, by a sin(ψ) and cos(ψ) extraction circuit, triangular waveform ψ into sin(ψ) and cos(ψ) using signal shaping or approximation methods.

9. An apparatus, comprising:

means for receiving a resolver excitation signal $V_{ex}(t)=A \sin(\omega t)$ and modulated resolver output signals $V_s(t,\theta)=A \times \sin(\theta) \times \sin(\omega t)$ and $V_C(t,\theta)=A \times \cos(\theta) \times \sin(\omega t)$, where ω is an angular frequency, t is time, and A is a constant determined by an amplitude of the resolver excitation signal;

means for generating absolute values of the modulated output signals $V_s(t,\theta)=A \times \sin(\theta) \times \sin(\omega t)$ and $V_C(t,\theta)=A \times \cos(\theta) \times \sin(\omega t)$;

means for producing an error signal based on the absolute values of the modulated output signals $V_s(t,\theta)=A \times \sin(\theta) \times \sin(\omega t)$ and $V_C(t,\theta)$ $A \times \cos(\theta) \times \sin(\omega t)$, wherein the error signal is related to the sine of a combination of an angle ψ and a true angle θ;

means for receiving the error signal;

means for generating an output signal based on the received error signal;

means for directly receiving the output signal;

means for integrating the output signal;

means for determining the angle ψ as an estimate of the true angle θ from the resolver excitation signal $V_{ex}(t)=A \sin(\omega t)$ and the modulated resolver output signals $V_s(t,\theta)=A \times \sin(\theta) \times \sin(\omega t)$ and $V_C(t,\theta)$ $A \times \cos(\theta) \times \sin(\omega t)$;

means for producing the angle ψ and two digital signals BitØ(θ) and Bit1(θ) for estimating the true angle θ using $V_{ex}(t)$, $V_s(t,\theta)$ and $V_C(t,\theta)$ signals;

means for outputting the angle ψ; and means for converting amplitudes of the modulated output signals into a measure of input angle, wherein the amplitudes of the modulated output signals are converted without using synchronized reference signals, demodulators, voltage controlled oscillators, low-pass filters, digital-to-analog converters, and look-up-tables, wherein the error signal converges to zero at steady state, and wherein the angle ψ is equivalent to an angle between 0 and π/2.

10. The apparatus according to claim 9, wherein the high frequency signal $V_{ex}(t)$ is an excitation signal generated by an external generator, and the modulated signals $V_s(t,\theta)$ and $V_C(t,\theta)$ are response signals received from an external device in response to the excitation signal $V_{ex}(t)$ and to a mechanical angle θ.

11. The apparatus according to claim 9, further comprising:

means for producing, by a phase detector, a $|\sin(\omega t)| \times (|\sin(\theta)|\cos(\psi) - |\cos(\theta)|\sin(\psi))$ signal from the signals $V_s(t,\theta)$, $V_C(t,\theta)$, sin(ψ) and cos(ψ);

means for ensuring, by a controller and integrator, that ψ tracks changes of the true angle θ; and means for using, by a quadrant identification circuit, the signals $V_{ex}(t)$, $V_s(t,\theta)$ and $V_C(t,\theta)$ to produce two binary signals BitØ(θ) and Bit1(θ) for identifying the four quadrants of the true angle θ.

12. The apparatus according to claim 9, further comprising:

means for converting, by a sin(ψ) and cos(ψ) extraction circuit, triangular waveform ψ into sin(ψ) and cos(ψ) using signal shaping or approximation methods.

* * * * *